(12) United States Patent
Nagai et al.

(10) Patent No.: US 11,710,614 B2
(45) Date of Patent: Jul. 25, 2023

(54) LIGHT INTERFERENCE SYSTEM AND SUBSTRATE PROCESSING APPARATUS

(71) Applicant: Tokyo Electron Limited, Tokyo (JP)

(72) Inventors: Kenji Nagai, Miyagi (JP); Hideaki Nagasaki, Miyagi (JP); Satoshi Suzuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 300 days.

(21) Appl. No.: 17/199,706

(22) Filed: Mar. 12, 2021

(65) Prior Publication Data

US 2021/0287876 A1    Sep. 16, 2021

(30) Foreign Application Priority Data

Mar. 13, 2020   (JP) ................................. 2020-044177
Feb. 15, 2021   (JP) ................................. 2021-021979

(51) Int. Cl.
| | |
|---|---|
| *H01J 37/244* | (2006.01) |
| *G02B 6/26* | (2006.01) |
| *G01B 11/06* | (2006.01) |
| *G01J 5/08* | (2022.01) |
| *G01J 5/00* | (2022.01) |

(52) U.S. Cl.
CPC ............ *H01J 37/244* (2013.01); *G01B 11/06* (2013.01); *G01J 5/00* (2013.01); *G01J 5/0896* (2013.01); *G02B 6/262* (2013.01); *H01J 2237/24585* (2013.01); *H01J 2237/334* (2013.01)

(58) Field of Classification Search
CPC ...... G02B 6/262; G02B 6/3624; G01B 11/06; G01B 11/0625; G01B 11/0675; G01J 5/0896
See application file for complete search history.

(56) References Cited

U.S. PATENT DOCUMENTS

| | | | |
|---|---|---|---|
| 10,359,316 B1 * | 7/2019 | Han ...................... | G01J 5/0853 |
| 2005/0265653 A1 * | 12/2005 | Cai ....................... | G02B 6/2552 385/28 |
| 2010/0206482 A1 * | 8/2010 | Matsudo ............... | G01J 5/0003 118/712 |

(Continued)

FOREIGN PATENT DOCUMENTS

| | | | | |
|---|---|---|---|---|
| CN | 105241842 | A | * | 1/2016 |
| CN | 105841824 | A | * | 8/2016 |

(Continued)

*Primary Examiner* — Michael A Lyons
(74) *Attorney, Agent, or Firm* — Pearne & Gordon LLP (57) ABSTRACT

A light interference system is provided. The light interference system includes a light source configured to generate a measurement light; a fiber configured to propagate therethrough the measurement light; and a measurement device. The fiber includes a single-mode fiber, a multimode fiber and a connector connecting the single-mode fiber and the multimode fiber. A tip end of the fiber is formed of the multimode fiber, and an end surface of the tip end of the fiber is configured to emit the measurement light to a measurement target object and receive a reflection light from the measurement target object. The measurement device is configured to measure physical property of the measurement target object based on the reflection light.

11 Claims, 9 Drawing Sheets

(56) References Cited

U.S. PATENT DOCUMENTS

| | | | |
|---|---|---|---|
| 2012/0281946 A1* | 11/2012 | Visagathilagar | G01H 9/004 385/12 |
| 2013/0033698 A1* | 2/2013 | Fujimori | G01B 11/0625 356/51 |
| 2015/0168231 A1* | 6/2015 | Koshimizu | G01B 9/02044 118/712 |
| 2020/0341189 A1* | 10/2020 | Wolff | G02B 6/02076 |

FOREIGN PATENT DOCUMENTS

| | | | | |
|---|---|---|---|---|
| JP | 2013-242267 A | | 12/2013 | |
| WO | WO-0233463 A1 | * | 4/2002 | ........... G02B 6/2551 |
| WO | WO-2016178595 A1 | * | 11/2016 | ........... G02B 6/0288 |
| WO | WO-2020248080 A1 | * | 12/2020 | ............. G01K 1/026 |

\* cited by examiner

LIGHT INTERFERENCE SYSTEM AND SUBSTRATE PROCESSING APPARATUS

CROSS-REFERENCE TO RELATED APPLICATION

This application claims the benefit of Japanese Patent Application No. 2020-044177 filed on Mar. 13, 2020, and Japanese Patent Application No. 2021-021979, filed on Feb. 15, 2021, the entire disclosures of which are incorporated herein by reference.

TECHNICAL FIELD

The exemplary embodiments described herein pertain generally to a light interference system and a substrate processing apparatus.

BACKGROUND

Patent Document 1 discloses a light interference system. This system includes a light source that emits a measurement light, a collimator, an optical fiber that connects the light source and the collimator, and an operation unit. The collimator emits the measurement light, which is adjusted to be a parallel light, to a measurement target object. The collimator acquires reflection lights from the measurement target object. The operation unit measures a thickness or a temperature of the measurement target object based on the reflection lights.
Patent Document 1: Japanese Patent Laid-open Publication No. 2013-242267

SUMMARY

In one exemplary embodiment, a light interference system is provided. The light interference system includes a light source configured to generate a measurement light; a fiber configured to propagate therethrough the measurement light; and a measurement device. The fiber includes a single-mode fiber, a multimode fiber and a connector connecting the single-mode fiber and the multimode fiber. A tip end of the fiber is formed of the multimode fiber, and an end surface of the tip end of the fiber is configured to emit the measurement light to a measurement target object and receive a reflection light from the measurement target object. The measurement device is configured to measure physical property of the measurement target object based on the reflection light.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

The following exemplary embodiments are examples for describing the present disclosure, and the present disclosure is not limited thereto. In the following description, same parts or parts having same function will be assigned same reference numerals, and redundant description will be omitted.

Hereinafter, various exemplary embodiments will be described.

If a light interference system has a probe including a collimator or a focuser, a measurement light emitted from the probe including the collimator is adjusted to be a parallel light and a measurement light emitted from the probe including the focuser is adjusted to be a converging light. The parallel light refers to a light configured to travel straight without being diffused. If the measurement light is in the form of parallel light, an optical axis of the collimator needs to be adjusted to project the parallel light to a measurement target object and project a reflection light from the measurement target object to the collimator. This adjustment operation for the parallel light has a high level of difficulty. Meanwhile, the converging light refers to a nonparallel light configured to connect the focus at a designed specific distance. If the measurement light is in the form of converging light, an optical axis of the focuser needs to be adjusted to project the converging light to the measurement target object and project a reflection light from the measurement target object to the focuser. This adjustment operation does not have a high level of difficulty as the light become parallel, but an angle tolerance is not necessarily high. In a general adjustment operation, the collimator or the focuser is provided on an optical mount and the optical mount functions to finely adjust an emission angle. For this reason, an installation space of the optical mount needs to be secured.

In one exemplary embodiment, a light interference system is provided. The light interference system includes a light source configured to generate a measurement light; a fiber configured to propagate therethrough the measurement light; and a measurement device. The fiber includes a single-mode fiber, a multimode fiber and a connector connecting the single-mode fiber and the multimode fiber. A tip end of the fiber is formed of the multimode fiber, and an end surface of the tip end of the fiber is configured to emit the measurement light to a measurement target object and receive a reflection light from the measurement target object. The measurement device is configured to measure physical property of the measurement target object based on the reflection light.

In the above-described exemplary embodiment, the measurement light is propagated into the multimode fiber, which has a thicker core than the single-mode fiber, by the connector. The propagated light is directly emitted to the measurement target object from an end surface of the multimode fiber. The reflection light from the measurement target object is projected to the end surface of the multimode fiber. According to the above-described exemplary embodiment, the multimode fiber has the thicker core than the single-mode fiber and thus can be easily re-coupled, and a sufficient amount of the reflection light can be obtained even if the measurement light is not in the form of parallel light. This light interference system does not require an optical mount for adjusting an optical axis, and, thus, an installation space of the optical mount is not needed. Therefore, this light interference system can measure physical property of the measurement target object with a structure simpler than conventional ones.

The connector may have a tapered core that connects a core of the multimode fiber and a core of the single-mode fiber. In this case, the light interference system can reduce a decrease in a light amount of the measurement light at the connector.

The fiber may have a cover configured to protect the end surface of the tip end of the fiber, and the cover may be made of a material configured to transmit the measurement light and disposed on the end surface of the tip end of the fiber. In this case, the light interference system can protect the end surface of the tip end of the fiber.

The cover and the end surface of the tip end of the fiber may be bonded to each other by an adhesive configured to transmit the measurement light.

The fiber may have an antireflection member configured to suppress reflection of the measurement light caused by the cover, and the antireflection member may be disposed between the end surface of the tip end of the fiber and the cover. In this case, the light interference system can reduce reflection of the measurement light at an interface between the end surface of the tip end of the fiber and the cover. Also, the antireflection member may be provided on an end surface of the cover at the measurement target object side. In this case, the light interference system can reduce reflection of the measurement light at an interface between the end surface of the cover at the measurement target object side and a vacuum space or an atmospheric space inside a processing chamber.

The end surface of the tip end of the fiber may be inclined from a plane orthogonal to an axial direction of the multimode fiber. In this case, the light interference system can reduce a reflection light, which is generated from a medium that propagates the measurement light and an interface with respect to the medium, by an incline of the end surface.

In another exemplary embodiment, a substrate processing apparatus including a light interference system; a chamber main body configured to be evacuated and to accommodate therein a measurement target object. The light interference system includes a light source configured to generate a measurement light; a fiber configured to propagate therethrough the measurement light; and a measurement device. The fiber includes a single-mode fiber, a multimode fiber and a connector connecting the single-mode fiber and the multimode fiber. A tip end of the fiber is formed of the multimode fiber, and an end surface of the tip end of the fiber is configured to emit the measurement light to a measurement target object and receive a reflection light from the measurement target object. The measurement device is configured to measure physical property of the measurement target object based on the reflection light.

In the above-described exemplary embodiment, the measurement light is propagated into the multimode fiber, which has the thicker core than the single-mode fiber, by the connector. The propagated light is directly emitted to the measurement target object from the end surface of the multimode fiber. The reflection light from the measurement target object is projected to the end surface of the multimode fiber. According to the above-described exemplary embodiment, the multimode fiber has the thicker core than the single-mode fiber and the end surface of the multimode fiber is close to the measurement target object, and, thus, the sufficient amount of the reflection light can be obtained even if the measurement light is not in the form of parallel light. This substrate processing apparatus can acquire the reflection light without adjusting the optical axis. This substrate processing apparatus can measure physical property of the measurement target object with a structure simpler than conventional ones. Also, this substrate processing apparatus does not require a collimator and thus can be scaled down compared to the conventional one.

In the exemplary embodiment, the chamber main body includes therein a placing table. The placing table has a plate to which a high frequency power is applied; and an electrostatic chuck disposed on the plate and configured to attract the measurement target object. A measurement hole penetrating the plate and the electrostatic chuck is formed in the placing table. The fiber includes a cover and a cylindrical coating member. The cover is made of a material configured to transmit the measurement light and bonded to the end surface of the tip end of the fiber by an adhesive configured to transmit the measurement light. The cover is configured to protect the tip end of the fiber. The cylindrical coating member is made of a conductive material and extended along an axial direction of the fiber to coat the adhesive and the cover. The fiber is inserted through the measurement hole such that the measurement target object placed on the placing table and the cover face each other. The coating member is inserted through the measurement hole along with the fiber and interposed between the fiber and the placing table. In such case, since an exposed surface area of the adhesive is reduced and a surface of the fiber is coated with the conductive coating member, the coating member can suppress the abnormal discharge occurring between the fiber and the placing table.

The coating member may be interposed between the fiber and an inner surface of the measurement hole formed in the electrostatic chuck. In such case, the coating member can suppress the abnormal discharge occurring between the electrostatic chuck and the fiber.

The coating member may include a lid extended along a diametrical direction of the fiber on a surface of the cover facing the measurement target object to coat the adhesive and the cover. In such case, since the exposed surface area of the adhesive is reduced, the coating member having the lid can suppress the abnormal discharge occurring between the fiber and the placing table.

A distance between the end surface of the tip end of the fiber and the measurement target object may be equal to or larger than 0.5 mm and equal to or smaller than 1.5 mm.

Hereinafter, exemplary embodiments of the present disclosure will be described with reference to the accompanying drawings. Further, the same or corresponding parts in the following description are designated by the same reference numerals and redundant explanation thereof will be omitted. The dimensional ratio of each drawing does not always match the actual dimensional ratio. Also, the terms "upper", "lower", "left" and "right" are used based on illustrated states, for convenience.

Figure 1:
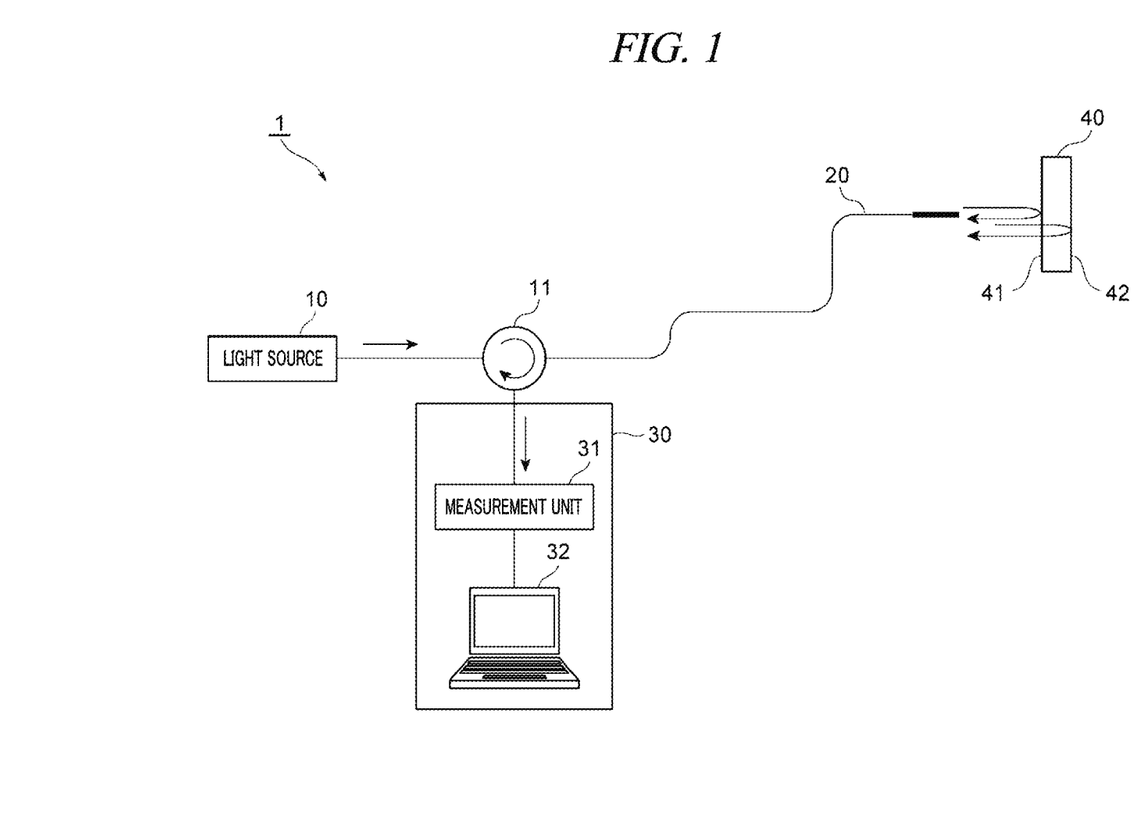
FIG. 1 is a diagram for explaining a configuration of a light interference system according to an exemplary embodiment.

FIG. 1 is a diagram for explaining a configuration of a light interference system 1 according to an exemplary embodiment of the present disclosure. As shown in FIG. 1, the light interference system 1 is configured to measure physical property of a measurement target object 40. The physical property may include, for example, a thickness or a temperature. Further, the thickness of the measurement target object 40 and the temperature of the measurement target object 40 can be measured by performing substantially the same operation. Thus, hereinafter, there will be explained an example where the light interference system 1 measures the temperature of the measurement target object 40 for the sake of easy explanation and understanding.

The light interference system 1 measures a temperature by using light interference. The light interference system 1 includes a light source 10, a fiber 20 and a measurement device 30.

The light source 10 is configured to generate a measurement light having a wavelength that transmits through the measurement target object 40. For example, an SLD (Super Luminescent Diode) is used as the light source 10. Also, the measurement target object 40 has, for example, a plate shape and includes a first main surface 41 and a second main surface 42 opposite to the first main surface 41. Hereinafter, the first main surface 41 will be referred to as a "front surface" and the second surface 42 will be referred to as a "rear surface" as necessary. The measurement target object 40 to be measured may be made of, for example, $SiO_2$ (quartz) or $Al_2O_3$ (sapphire) in addition to Si (silicon).

The fiber 20 includes a single-mode fiber 21, a multimode fiber 22 and a connector 23. The single-mode fiber 21 and the multimode fiber 22 are examples of an optical fiber. The optical fiber includes a core and a clad which are different in refractive index from each other, and the core is disposed at the center and the clad is disposed to surround and cover the core. A light projected to the optical fiber is propagated while being totally reflected from an interface between the core and the clad. The multimode fiber 22 has a diameter of the core (core diameter) greater than that of the single-mode fiber 21. For example, the single-mode fiber 21 has the core diameter of ϕ9 μm to ϕ10 μm. For example, the multimode fiber 22 has the core diameter of ϕ50 μm or ϕ62.5 μm. The connector 23 is configured to connect the single-mode fiber 21 to the multimode fiber 22. Details of the connector 23 will be described later.

The multimode fiber 22 may be any one of an SI (Step Index) fiber and a GI (Graded Index) fiber. In the GI fiber, the refractive index of the core varies gradually between the center and the periphery thereof. In the GI fiber, the measurement light being propagated has a small phase difference, and, thus, the GI fiber can reduce noise compared to the SI fiber.

A tip end of the fiber 20 is formed of the multimode fiber 22. An end surface of the tip end of the fiber 20 formed of the multimode fiber 22 is configured to emit a measurement light, which is generated by the light source 10, to the measurement target object 40 and receive a reflection light from the measurement target object 40. Details of the tip end of the fiber 20 will be described later.

An optical circulator 11 is connected to the fiber 20. The optical circulator 11 is configured to propagate the measurement light, which is generated by the light source 10, to the end surface of the tip end of the fiber 20. The optical circulator 11 emits the reflection light, which is projected from the end surface of the tip end of the fiber 20, to the measurement device 30.

The measurement device 30 is configured to measure the temperature of the measurement target object 40 based on a reflection light spectrum. The measurement device 30 may include, for example, a measuring unit 31 and an operation unit 32. The measuring unit 31 measures the spectrum of the reflection light acquired from the optical circulator 11. The reflection light spectrum shows an intensity distribution depending on a wavelength or a frequency of the reflection light.

The measuring unit 31 includes, for example, a light dispersing element and a light receiving unit. The light dispersing element is, for example, a diffraction grating and is configured to disperse a light at a predetermined dispersion angle for each wavelength. The light receiving unit is configured to receive the light dispersed by the light dispersing element. For example, a CCD (Charge Coupled Device) in which a plurality of light receiving elements is arranged in a grid pattern is used as the light receiving unit. The number of the light receiving elements becomes a sampling number. Further, a wavelength span is determined based on the dispersion angle of the light dispersing element and a distance between the light dispersing element and the light receiving element. Thus, the reflection light is dispersed at each wavelength or each frequency so that the intensity thereof is acquired at each wavelength or each frequency. The measuring unit 31 outputs the reflection light spectrum to the operation unit 32.

The operation unit 32 is configured to measure the temperature of the measurement target object 40 based on the reflection light spectrum. The operation unit 32 includes an optical path length calculator, a temperature calculator and temperature correcting data. The optical path length calculator performs Fourier transform and data interpolation, and central position calculation using the reflection light spectrum to calculate an optical path length of the measurement target object 40. The temperature calculator calculates the temperature of the measurement target object 40 based on the optical path length. The temperature calculator calculates the temperature of the measurement target object 40 with reference to the temperature correcting data. The temperature correcting data is data measured in advance and indicates a relationship between the temperatures and the optical path lengths. With the above-described configuration, the light interference system 1 measures the temperature by using the light interference between the front surface 41 and the rear surface 42 of the measurement target object 40 (FFT frequency domain method).

Figure 2:
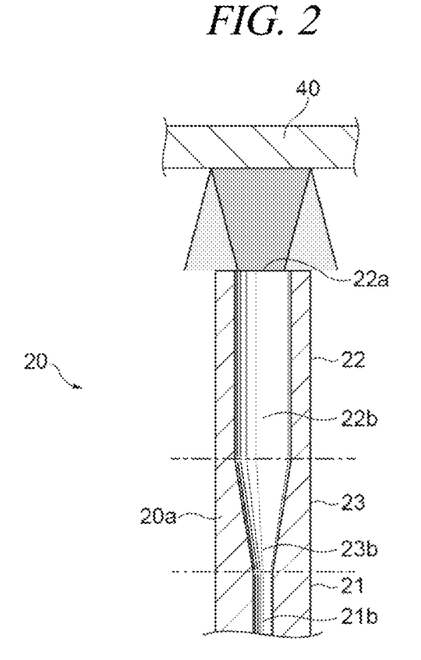
FIG. 2 is a partial enlarged view of a cross section of a fiber according to the exemplary embodiment.

FIG. 2 is a partial enlarged view of a cross section of the fiber 20 according to the exemplary embodiment. FIG. 2 illustrates an operation in which a measurement light emitted from an end surface 22a of the tip end of the fiber 20 is reflected by the measurement target object 40 and then projected as a reflection light to the end surface 22a. A core 22b of the multimode fiber 22 and a core 21b of the single-mode fiber 21 are connected with each other by a core 23b of the connector 23. The core 21b, the core 22b and the core 23b are surrounded by a clad 20a.

In the example shown in FIG. 2, the connector 23 has the tapered core 23b. The connector 23 connects the core 22b of the multimode fiber 22 and the core 21b of the single-mode fiber 21 by the tapered core 23b. The tapered core 23b has a diameter gradually decreasing from the multimode fiber 22 toward the single-mode fiber 21. Since the diameter of the core 23b is gradually changed, it is possible to suppress a coupling loss when light is propagated. Therefore, the tapered core 23b suppresses a decrease in light amount at the connector 23.

The connector 23 is not limited to a member that is integrally formed with the single-mode fiber 21 and the multimode fiber 22. For example, the connector 23 may be a member that is integrally formed with any one of the single-mode fiber 21 and the multimode fiber 22. The connector 23 may be a member that is provided separately from the single-mode fiber 21 and the multimode fiber 22.

Figure 3:
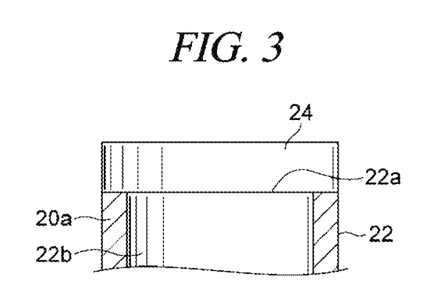
FIG. 3 is a partial enlarged view of the cross section of the fiber having a cover according to the exemplary embodiment.

FIG. 3 is a partial enlarged view of a cross section of the fiber having a cover 24 according to the exemplary embodiment. The cover 24 is disposed on the end surface 22a of the tip end of the fiber 20. The cover 24 is made of a material that transmits the measurement light and the reflection light. The material of the cover 24 is, for example, Si, $SiO_2$, $Al_2O_3$ and YAG (Yttrium Aluminum Garnet). The cover 24 may have a thickness of, for example, about 1.0 mm. The thickness of the cover 24 is not limited to about 1.0 mm, but may be designed such that a signal generation position obtained after fast Fourier transform at an optical interface between an optical path length of the cover 24 and a cavity between the cover 24 and the measurement target object 40 does not overlap a signal obtained after fast Fourier transform of the measurement target object 40. The cover 24 is configured to protect the end surface 22a of the tip end of the fiber 20 against consumption and contamination caused by plasma. For example, the cover 24 and the end surface 22a may be bonded to each other by an adhesive that transmits the measurement light. The adhesive includes, for example, acrylic-based, epoxy-based and silicon-based adhesives, and is cured by ultraviolet irradiation, heat or a curing agent.

Figure 4:
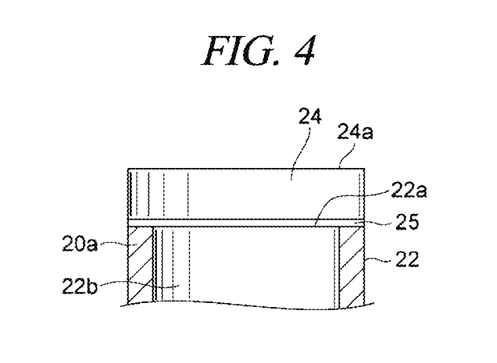
FIG. 4 is a partial enlarged view of the cross section of the fiber having the cover and an antireflection member according to the exemplary embodiment.

FIG. 4 is a partial enlarged view of a cross section of the fiber 20 having the cover 24 and an antireflection member 25 according to the exemplary embodiment. The antireflection member 25 is disposed between the end surface 22a of the tip end of the fiber 20 and the cover 24. The antireflection member 25 is formed of a thin film, such as $Al_2O_3$ or $MgF_2$ (magnesium fluoride), coated on the cover 24. The antireflection member 25 suppresses reflection at an interface between the cover 24 and the core 22b. Specifically, the antireflection member 25 suppresses Fresnel reflection at the interface between the core 22b of the multimode fiber 22 and the cover 24 which are different in refractive index from each other. The antireflection member 25 may also be disposed on an end surface 24a of the cover 24 at the measurement target object side. In this case, the antireflection member 25 is made of a material that has resistance against plasma and thus does not cause contamination inside a processing chamber 102. If the antireflection member 25 is disposed on both the interface between the cover 24 and the core 22b and the end surface 24a of the cover 24 at the measurement target object side, the antireflection member 25 suppresses reflection at the interface of the cover 24. A reflection light from the cover 24 decreases an S/N ratio of a reflection light from the measurement target object 40, which results in an increase in the non-uniformity of temperatures measured by the measurement device 30. Therefore, the antireflection member 25 suppresses the reflection of the measurement light at the cover 24 and thus decreases the non-uniformity of temperatures measured by the measurement device 30.

Figure 5:
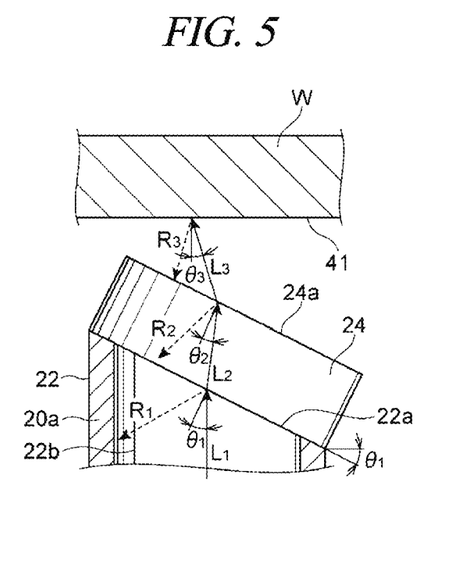
FIG. 5 is a partial enlarged view of the cross section of the fiber whose end surface at a tip end is inclined according to the exemplary embodiment.

FIG. 5 is a partial enlarged view of a cross section of the fiber 20 whose tip end has the inclined end surface 22a according to an exemplary embodiment of the present disclosure. In FIG. 5, the fiber 20 includes the cover 24. The cover 24 is disposed on the inclined end surface 22a. The end surface 22a of the tip end of the fiber 20 is inclined from a plane orthogonal to an axial direction of the multimode fiber 22.

A measurement light $L_1$ that propagates in the core 22b of the multimode fiber 22 in the axial direction is emitted to the cover 24 at an incident angle $\theta_1$. An inclination angle $\theta_1$ of the cover 24 geometrically coincides with the incident angle $\theta_1$ of the measurement light $L_1$. The measurement light $L_1$ is refracted at the interface between the end surface 22a and the cover 24 to be changed into a measurement light $L_2$. A part of the measurement light $L_1$ is reflected at the interface between the end surface 22a and the cover 24 so that a reflection light $R_1$ is projected to the core 22b.

A measurement light $L_2$ that propagates the inside of the cover 24 is emitted to an outer space at an incident angle $\theta_2$. The outer space is in a vacuum state or is filled with a certain gas. The measurement light $L_2$ is refracted at an interface between the end surface 24a and the outer space to be changed into a measurement light $L_3$. The measurement light $L_3$ that propagates the outer space is emitted to the measurement target object 40 at an incident angle $\theta_3$. The front surface 41 and the rear surface 42 (not shown) reflect the measurement light $L_3$ and project a reflection light $R_3$ to the cover 24. A part of the measurement light $L_2$ is reflected at the interface between the end surface 24a and the outer space so that a reflection light $R_2$ is projected to the cover 24. The reflection light $R_2$ is also projected to the core 22b.

If the end surface 22a has the inclination angle $\theta_1$ of 0 degree from the plane orthogonal to the axial direction of the multimode fiber 22, i.e., the end surface 22a is not inclined, the reflection light $R_1$ and reflection light $R_2$ projected to the core 22b decrease the S/N ratio of the reflection light $R_3$ from the measurement target object 40. If the end surface 22a is inclined, the reflection light $R_1$ and reflection light $R_2$ projected to the core 22b have a high incident angle with respect to an interface between the core 22b and the clad 20a, so that they do not reach the measurement device 30 and do not affect the S/N ratio of the reflection light $R_3$. Therefore, the inclined end surface 22a suppresses the reflection light $R_1$ and reflection light $R_2$, which may reach the measurement device 30, and thus improves the accuracy of the temperature measured by the measurement device 30.

Figure 6:
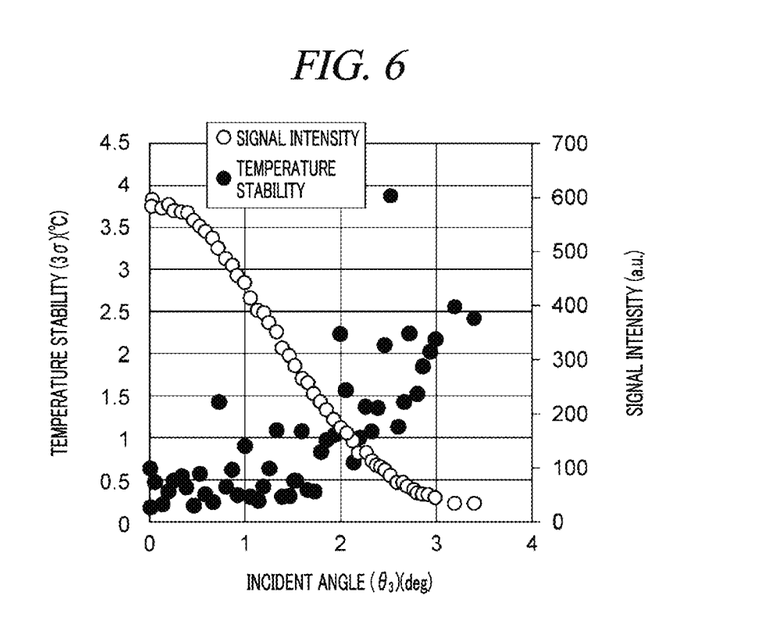
FIG. 6 is a graph showing an example of a relationship between an incident angle of a measurement light with respect to a measurement target object and measurement results based on a reflection light.

FIG. 6 is a graph showing an example of a relationship between the incident angle $\theta_3$ of the measurement light $L_3$ with respect to the measurement target object 40 and the measurement result acquired from the measurement device 30. A signal intensity and a temperature stability 3σ shown in FIG. 6 are obtained based on the reflection light $R_3$ obtained by projecting the measurement light $L_3$ to the measurement target object 40 at the incident angle $\theta_3$. In FIG. 6, white circles represent the signal intensity and their values are marked on the right longitudinal axis. Also, black circles represent the temperature stability 3σ and their values are marked on the left longitudinal axis. Both the signal intensity and the temperature stability 3σ vary depending on the incident angle $\theta_3$.

The signal intensity is a value digitized by the measurement device 30 based on the reflection light $R_3$, and its value increases as the light amount of the reflection light $R_3$ increases. If the incident angle $\theta_3$ increases, a part of the reflection light $R_3$ is reflected again at the end surface 24a and the end surface 22a, and, thus, the signal intensity decreases. The signal intensity has a maximum value when the incident angle $\theta_3$ is equal to 0 degree, i.e., the end surface 22a is not inclined. The signal intensity decreases exponentially as the incident angle $\theta_3$ increases. When the incident angle $\theta_3$ exceeds 4 degrees, the signal intensity decreases to about 10 a.u. When the incident angle $\theta_3$ is at least larger than 0 degree and equal to or smaller than 2 degrees, the light interference system 1 can measure the temperature of the measurement target object 40 with sufficient accuracy.

The temperature stability $3\sigma$ indicates an error range of the temperature of the measurement target object 40 calculated by the measurement device 30 based on the reflection light $R_3$. Herein, $3\sigma$ refers to data within $3\sigma$ of standard deviation. For example, the temperatures measured by the measurement device 30 are not uniform whenever measured. This non-uniformity includes extremely high and extremely low levels. Therefore, the temperature stability $3\sigma$ indicates the non-uniformity of the measurement result based on the measurement result within the $3\sigma$ range. The temperature stability $3\sigma$ is equal to a minimum value of ±0.5° C. when the end surface 22a is not inclined, i.e., the incident angle $\theta_3$ is equal to 0 degree. Since the signal intensity decreases as the incident angle $\theta_3$ increases, the temperature stability $3\sigma$ is degraded as the incident angle $\theta_3$ increases. When the incident angle $\theta_3$ is equal to 2 degrees, the temperature stability $3\sigma$ is changed to ±1.0° C. The temperature stability $3\sigma$ is degraded exponentially when the incident angle $\theta_3$ is higher than 2 degrees. For example, when the incident angle $\theta_3$ is equal to 4 degrees, the temperature stability $3\sigma$ is changed to ±2.0° C. When the incident angle $\theta_3$ is at least larger than 0 degree and equal to or smaller than 2 degrees, the degradation rate of the temperature stability $3\sigma$ can be reduced.

For example, a relationship among the incident angle $\theta_1$, the incident angle $\theta_2$ and the incident angle $\theta_3$ is as follows. When the end surface 22a is inclined at the inclination angle $\theta_1$ of 4.0 degrees from the plane orthogonal to the axial direction of the multimode fiber 22, the incident angle $\theta_1$ is equal to 4.0 degrees. In this case, the measurement light $L_2$ is refracted at the interface of the end surface 22a, and, thus, the incident angle $\theta_2$ is equal to 3.3 degrees. The measurement light $L_3$ is refracted at the interface of the end surface 24a, the incident angle $\theta_3$ is equal to 2.0 degrees. The incident angle $\theta_3$ is about half the incident angle $\theta_1$. Therefore, when the incident angle $\theta_3$ is set to be lower than 4.0 degrees, the inclination angle $\theta_1$ is in the range of higher than 0 degree and lower than 8.0 degrees. When the incident angle $\theta_3$ is set to be lower than 2.0 degrees, the inclination angle $\theta_1$ is in the range of higher than 0 degree and lower than 4.0 degrees.

A distance between the end surface 22a of the tip end of the fiber 20 and the measurement target object 40 may be equal to or larger than 0.5 mm and equal to or smaller than 1.5 mm. Specifically, the measurement target object 40 and the fiber 20 just need to be disposed such that a distance between the first main surface 41 of the measurement target object 40 and the end surface 22a of the tip end of the fiber 20 is from 0.5 mm to 1.5 mm. Accordingly, it is possible to secure the accuracy required for signal intensity.

Also, if the cover 24 is disposed at the end surface 22a of the tip end of the fiber 20, the thickness of the cover 24 may be designed such that the signal generation position obtained after fast Fourier transform at the optical interface between the optical path length of the cover 24 and the cavity between the cover 24 and the measurement target object 40 does not overlap the signal obtained after fast Fourier transform of the measurement target object 40.

Figure 7:
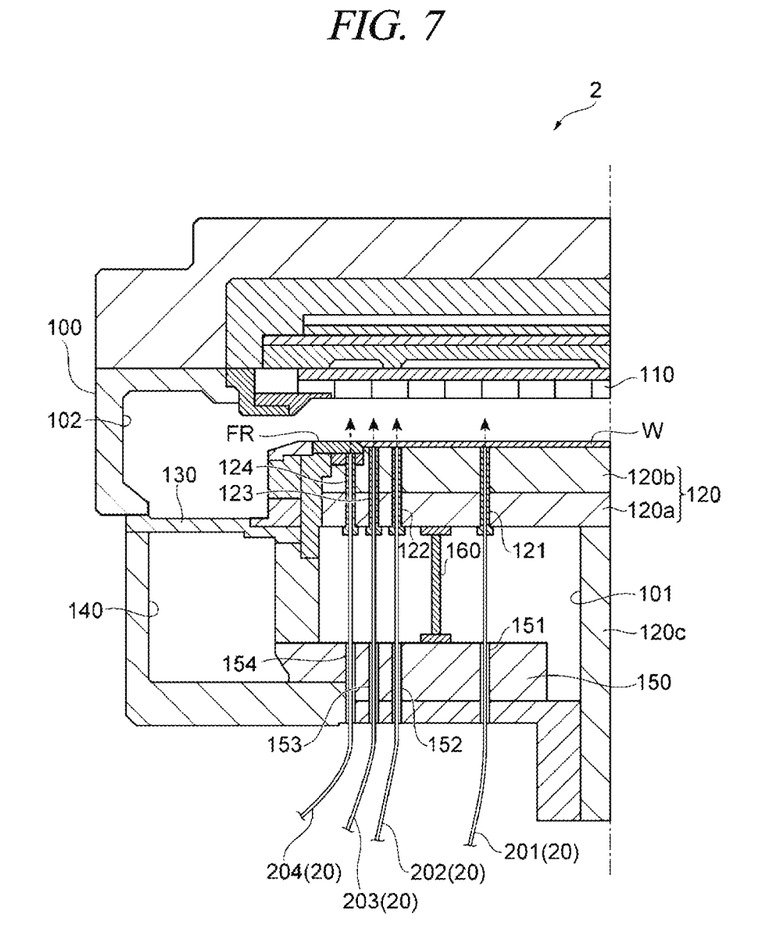
FIG. 7 is a cross-sectional view for explaining a configuration of a substrate processing apparatus according to the exemplary embodiment.

FIG. 7 is a cross-sectional view for explaining a configuration of a substrate processing apparatus 2 according to an exemplary embodiment. Herein, there will be explained an example where the light interference system 1 is used to measure the temperature of a wafer or a focus ring in the substrate processing apparatus 2 such as a plasma etching apparatus.

As shown in FIG. 7, the substrate processing apparatus 2 includes a chamber main body 100 that accommodates therein a semiconductor wafer W as a substrate and processes the semiconductor wafer W with plasma.

In the chamber main body 100, a processing chamber 102 is partitioned and provided. The processing chamber 102 is configured to be evacuated. In the processing chamber 102, a placing table 120 configured to place the semiconductor wafer W thereon is disposed. The placing table 120 is made of a conductive material, and includes an RF plate 120a to which a high frequency power is applied and an electrostatic chuck 120b disposed on the RF plate 120a and configured to attract the semiconductor wafer W. A central portion of the RF plate 120a is connected to a power feed rod 120c electrically connected to a high frequency power supply (not shown).

Around the placing table 120, a baffle plate 130 is annularly provided to surround the placing table 120. Under the baffle plate 130, an annular evacuation space 140 for uniform evacuation around the placing table 120 is formed. Further, a base plate 150 is provided at a bottom portion of the chamber main body 100, and a space 101 is formed between the RF plate 120a and the base plate 150. This space 101 has an area sufficient to insulate the RF plate 120a and the base plate 150. Furthermore, within the space 101, there is provided a driving device (not shown) of a pusher pin configured to receive the semiconductor wafer W from a transfer arm, place the semiconductor wafer W on the placing table 120 or lift up the semiconductor wafer W from the placing table 120 and deliver the semiconductor wafer W to the transfer arm. Also, this space 101 is not in a vacuum atmosphere state, but is in an atmospheric atmosphere state.

Above the placing table 120, a facing electrode 110 is disposed to face the placing table 120 with a space therebetween. This facing electrode 110 is configured as a so-called shower head and configured to supply a predetermined processing gas in a shower shape toward the semiconductor wafer W placed on the placing table 120. The facing electrode 110 may have a ground potential or may be applied with a high frequency power. Further, a focus ring FR is disposed around the semiconductor wafer W on the placing table 120. This focus ring FR is configured to improve the in-plane uniformity of the plasma processing on the semiconductor wafer W.

The chamber main body 100 has a configuration in which the processing chamber 102 as an upper space of the placing table 120 has a vacuum atmosphere and the space 101 under the placing table 120 has a normal pressure atmosphere. Therefore, the placing table 120 serves as a part of a partition wall that separates the vacuum atmosphere from the normal pressure atmosphere. Further, in the placing table 120, a plurality of temperature measurement holes 121, 122, 123 and 124 is formed. The temperature measurement holes 121, 122, 123 and 124 are formed such that the fiber 20 of the light interference system 1 can pass through an upper surface and a lower surface of the placing table 120, and are airtightly sealed by fiber feedthrough.

In the exemplary embodiment, among the temperature measurement holes 121, 122, 123 and 124, the outermost temperature measurement hole 124 in the placing table 120 is configured to measure the temperature of the focus ring FR. The other temperature measurement holes 121, 122 and 123 are configured to measure the temperature of the semiconductor wafer W.

In the base plate 150, for example, through holes 151, 152, 153 and 154 are formed corresponding to the temperature measurement holes 121, 122, 123 and 124, respectively. Fibers 201, 202, 203 and 204 as parts of the light interference system 1 are fixed at the through holes, respectively. Instead of the through holes 151, 152, 153 and 154, a single through hole may be formed, and the fibers 201, 202, 203 and 204 may be collected to be fixed at the single through hole. Further, a connection member 160 for connecting the base plate 150 and the placing table 120 (RF plate 120a) is disposed in the space 101 between the base plate 150 and the placing table 120 (RF plate 120a). Although FIG. 7 illustrates only one connection member 160, a plurality of (for example, four or more) connection members 160 is disposed along a circumferential direction. These connection members 160 are configured to suppress deformation or vibration of the placing table 120.

The fibers 201, 202, 203 and 204 are examples of the fiber 20. In this case, the fiber 20 may have an optical switch between the optical circulator 11 and the tip end of the fiber 20. The optical switch includes, for example, one input terminal and four output terminals. The input terminal is connected to the optical circulator 11. Also, the four output terminals are connected to the fibers 201, 202, 203 and 204, respectively. The optical switch is configured to switch an output destination. The optical switch alternately propagates a light of the optical circulator 11 from the input terminal to the four output terminals.

In the light interference system 1, a measurement light is emitted from an end surface of a tip end of each of the fibers 201, 202, 203 and 204 and reflected from the semiconductor wafer W and the focus ring FR serving as a measurement target object on the placing table 120. Reflection lights from the semiconductor wafer W and the focus ring FR are projected to the end surface of the tip end of each of the fibers 201, 202, 203 and 204. The optical switch alternately propagates the reflection lights acquired from the fibers 201, 202, 203 and 204 to the optical circulator 11.

Figure 8:
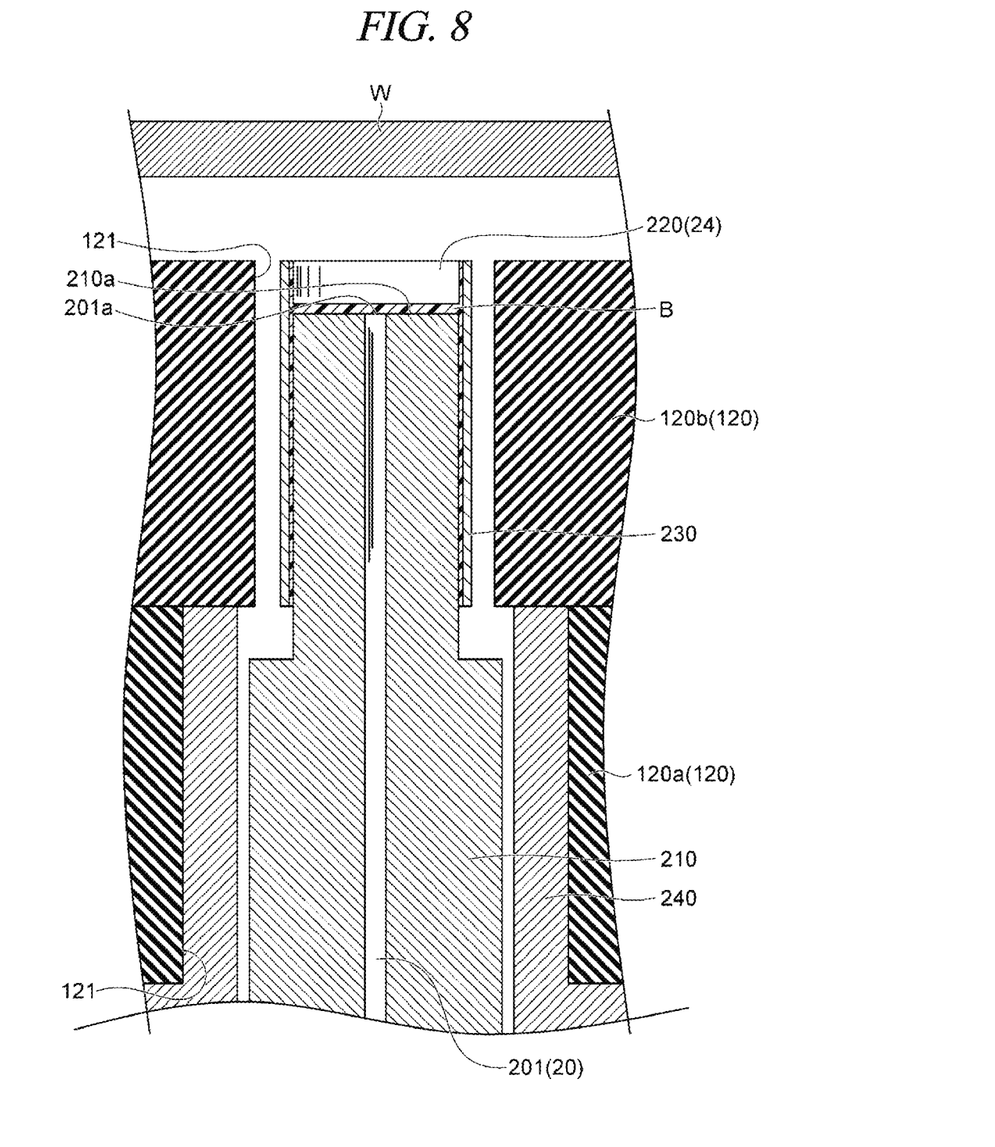
FIG. 8 is a partial enlarged view of a cross section of a fiber in a substrate processing apparatus according to an exemplary embodiment.

FIG. 8 is a partial enlarged view of a cross section of a fiber in a substrate processing apparatus according to an exemplary embodiment. FIG. 8 enlarges the cross section of the fiber 201 fixed at the temperature measurement hole 121. This fiber may be any one of the fibers 201, 202, 203 and 204, and this temperature measurement hole may be any one of the temperature measurement holes 121, 122, 123 and 124. A sleeve 240 is inserted through the temperature measurement hole 121. The sleeve 240 is configured to fix the fiber 201 at the temperature measurement hole 121. If the fiber 201 is directly fixed at the temperature measurement hole 121, the sleeve 240 may not be provided.

The fiber 201 has a structural member 210 and a cover 220. The structural member 210 surrounds and covers the fiber 201 and extends along an axial direction of the fiber 201. A material of the structural member 210 is, for example, alumina ceramics or sapphire. The structural member 210 is configured to fix the fiber 201 such that the fiber 201 extends along the temperature measurement hole 121. The cover 220 is an example of the cover 24. The cover 220 is bonded to an end surface 201a of a tip end of the fiber 201 by an adhesive B. The adhesive B transmits the measurement light. The adhesive B includes, for example, acrylic-based, epoxy-based and silicon-based adhesives, and is cured by ultraviolet irradiation, heat or a curing agent. The cover 220 is bonded to the end surface 201a of the tip end of the fiber 201 and also bonded to an end surface 210a of the structural member 210 located on the same level with the end surface 201a.

The fiber 201 also has a cylindrical coating member 230. The coating member 230 is made of a conductive material, for example, Si or SiC. The cylindrical coating member 230 is extended along the axial direction of the fiber 201 to coat the adhesive B and the cover 220. Specifically, the coating member 230 is configured to coat the adhesive B that bonds the cover 220 to the end surface 201a and the end surface 210a. Also, the coating member 230 is extended from the cover 220 to coat the structural member 210. The coating member 230 is interposed between an inner surface of the temperature measurement hole 121 formed in the electrostatic chuck 120b and the fiber 201. The coating member 230 may be interposed between an inner surface of the temperature measurement hole 121 formed in the RF plate 120a and the fiber 201.

Since the coating member 230 coats the adhesive B and the cover 220, the area of the adhesive B exposed to the processing chamber 102 of the vacuum atmosphere is decreased. Thus, the amount of the gas volatilized from the adhesive B is reduced. Therefore, when the plasma processing is performed, the coating member 230 can suppress the abnormal discharge occurring between the fiber 201 and the placing table 120. Since the coating member 230 is extended along a range where the temperature measurement hole 121 is formed through the electrostatic chuck 120b, it is possible to suppress the abnormal discharge occurring between the fiber 201 and the electrostatic chuck 120b.

Also, since the conductive coating member 230 is inserted through the temperature measurement hole 121, a space for electrons to be accelerated in the temperature measurement hole 121 is decreased. For this reason, the coating member 230 can suppress the abnormal discharge occurring between the fiber 201 and the placing table 120.

Figure 9:
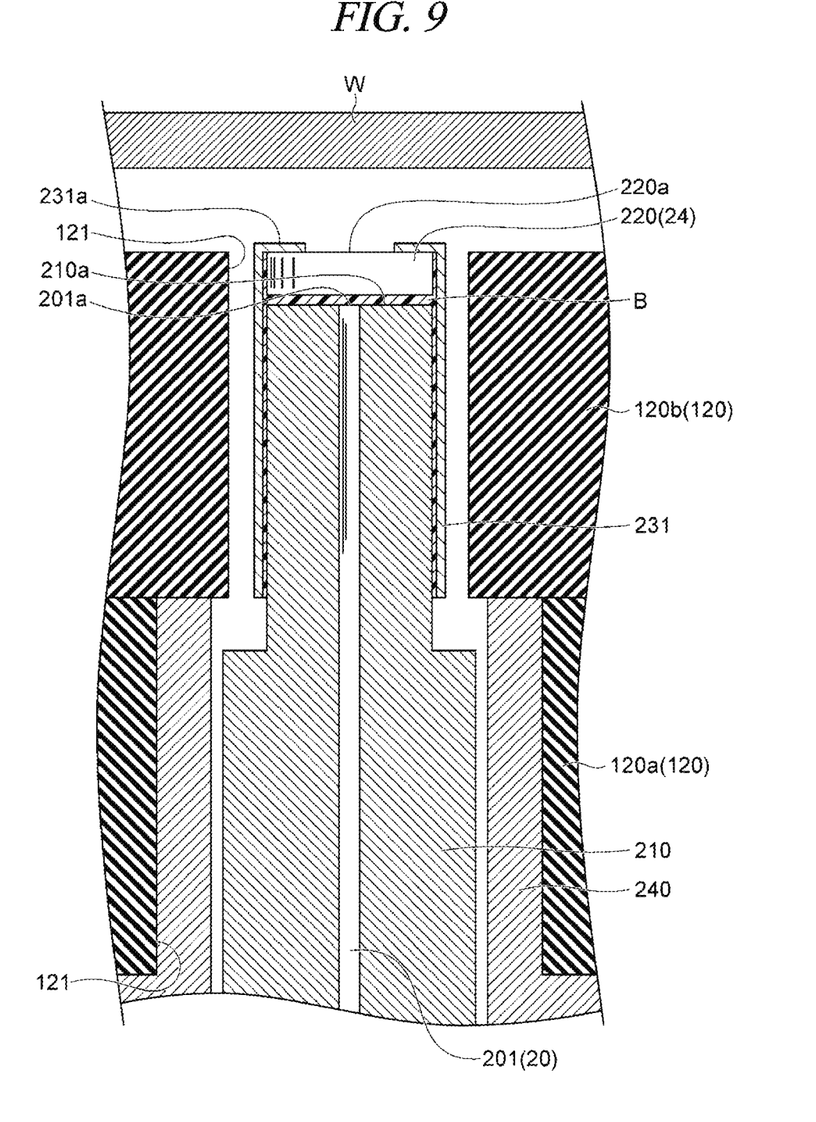
FIG. 9 is a partial enlarged view of a cross section of a fiber in a substrate processing apparatus according to an exemplary embodiment.

FIG. 9 is a partial enlarged view of a cross section of a fiber in a substrate processing apparatus according to an exemplary embodiment. FIG. 9 enlarges the cross section of the fiber 201 having a coating member 231 and fixed at the temperature measurement hole 121. The coating member 231 is a modification example of the coating member 230.

The coating member 231 includes a lid 231a. The lid 231a is extended along a diametrical direction of the fiber 201 on a surface of the cover 220 facing the semiconductor wafer W so as to coat the adhesive B and the cover 220. Specifically, the lid 231a is extended inwards in the diametrical direction along an end surface 220a of the cover 220. A hole is formed at the center of the lid 231a in the diametrical direction, and the end surface 220a of the cover 220 is exposed through this hole. This hole has a diameter of, for example, 0.3 mm.

In this case, the surface area of the exposed adhesive B is further decreased. Therefore, the coating member 231 including the lid 231a can suppress the abnormal discharge occurring between the fiber 201 and the placing table 120 more effectively.

As described above, the substrate processing apparatus 2 is equipped with the light interference system 1 and thus can measure the thicknesses and the temperatures of the semiconductor wafer W and the focus ring FR. Also, if an in-chamber member, such as the focus ring FR, accommodated in the processing chamber is the measurement target object, the in-chamber member is made of a material that transmits the measurement light. For example, the material of the in-chamber member may be Si, $SiO_2$, SiC and $Al_2O_3$.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

According to the exemplary embodiment of the present disclosure, the physical property of the measurement target object can be measured with the simple structure.

We claim:

1. A light interference system, comprising:
a light source configured to generate a measurement light;
a fiber, configured to propagate therethrough the measurement light, including a single-mode fiber, a multimode fiber and a connector connecting the single-mode fiber and the multimode fiber, a tip end of the fiber being formed of the multimode fiber and an end surface of the tip end of the fiber being configured to emit the measurement light to a measurement target object and receive a reflection light from the measurement target object; and
a measurement device configured to measure physical property of the measurement target object based on the reflection light.

2. The light interference system of claim 1,
wherein the connector has a tapered core that connects a core of the multimode fiber and a core of the single-mode fiber.

3. The light interference system of claim 1,
wherein the fiber has a cover configured to protect the end surface of the tip end of the fiber, and
the cover is made of a material configured to transmit the measurement light and is disposed on the end surface of the tip end of the fiber.

4. The light interference system of claim 3,
wherein the cover and the end surface of the tip end of the fiber are bonded to each other by an adhesive configured to transmit the measurement light.

5. The light interference system of claim 3,
wherein the fiber has an antireflection member configured to suppress reflection of the measurement light caused by the cover, and
the antireflection member is disposed between the end surface of the tip end of the fiber and the cover.

6. The light interference system of claim 3,
wherein the end surface of the tip end of the fiber is inclined from a plane orthogonal to an axial direction of the multimode fiber.

7. The light interference system of claim 1,
wherein a distance between the end surface of the tip end of the fiber and the measurement target object is equal to or larger than 0.5 mm and equal to or smaller than 1.5 mm.

8. A substrate processing apparatus, comprising:
a light interference system; and
a chamber main body configured to be vacuum-evacuated and to accommodate therein a measurement target object,
wherein the light interference system includes:
a light source configured to generate a measurement light;
a fiber, configured to propagate therethrough the measurement light, including a single-mode fiber, a multimode fiber and a connector connecting the single-mode fiber and the multimode fiber, a tip end of the fiber being formed of the multimode fiber and an end surface of the tip end of the fiber being configured to emit the measurement light to the measurement target object and receive a reflection light from the measurement target object; and
a measurement device configured to measure physical property of the measurement target object based on the reflection light.

9. The substrate processing apparatus of claim 8,
wherein the chamber main body includes therein a placing table having a plate to which a high frequency power is applied; and an electrostatic chuck disposed on the plate and configured to attract the measurement target object, a measurement hole penetrating the plate and the electrostatic chuck being formed in the placing table,
wherein the fiber includes:
a cover made of a material configured to transmit the measurement light and bonded to the end surface of the tip end of the fiber by an adhesive configured to transmit the measurement light, the cover being configured to protect the tip end of the fiber; and
a cylindrical coating member made of a conductive material and extended along an axial direction of the fiber to coat the adhesive and the cover, and
wherein the fiber is inserted through the measurement hole such that the measurement target object placed on the placing table and the cover face each other, and
the coating member is inserted through the measurement hole along with the fiber.

10. The substrate processing apparatus of claim 9,
wherein the coating member is interposed between the fiber and an inner surface of the measurement hole formed in the electrostatic chuck.

11. The substrate processing apparatus of claim 9,
wherein the coating member includes a lid extended along a diametrical direction of the fiber on a surface of the cover facing the measurement target object to coat the adhesive and the cover.

* * * * *